May 7, 1963 C. L. SPRAGUE ET AL 3,088,434

PRINTED CIRCUIT APPARATUS

Filed May 2, 1955

INVENTORS:
CARLTON L. SPRAGUE,
IRVING W. WOLF,

BY Charles W. Helzer

THEIR ATTORNEY.

United States Patent Office 3,088,434

Patented May 7, 1963

3,088,434

PRINTED CIRCUIT APPARATUS

Carlton L. Sprague, Liverpool, and Irving William Wolf, Syracuse, N.Y., assignors, by mesne assignments, to the United States of America as represented by the Secretary of the Army Filed May 2, 1955, Ser. No. 505,264
1 Claim. (Cl. 118—410)

The present invention relates to electrical circuits of the printed type.

More specifically, the invention relates to a new and improved method and apparatus for dispensing printed circuit inks onto backing members in the fabrication of printed type electric circuits.

One of the more troublesome problems encountered in the fabrication of printed type electric circuits has been the inability of the fabricators to achieve uniformity in the ultimate electrical characteristics of this type of circuit element. For example, heretofore in the production of printed type electric resistors produced by depositing a printed circuit ink (such as finely pulverized carbon supported in a suitable liquid carrier), upon an insulating backing member, great difficulty has been experienced in obtaining identical electrical resistance in the successively produced printed resistor, or at least, in maintaining undesired variations in the electrical resistance values of successively produced printed resistor elements within acceptable tolerance ranges.

It was determined that these undesired variations in electrical characteristics were due primarily to different amounts of printed circuit inks being deposited during successive operations by the ink dispensing method and apparatus heretofore used to produce these elements. Hence, it was necessary to obtain more satisfactory techniques and apparatus for dispensing printed circuit inks, and in the attempt to do so, the present invention was devised.

It is therefore one object of the present invention to provide a printed circuit element wherein a large percentage of successively produced circuit elements all have similar electrical characteristics, and any variations in the electrical characteristics that do occur in some of the elements, are within acceptable tolerance ranges.

Another object of the invention is to provide a new and improved method and apparatus for dispensing printed circuit inks onto backing members to produce printed circuit elements having the above-described characteristics.

In practicing the invention, a method and apparatus for dispensing printed circuit inks are provided which utilize a container for the printed circuit ink that has an outlet orifice which may be disposed adjacent a material to be inked, and a fluid type opening for replenishing the supply of ink retained therein. Means are provided for subjecting the ink within the container to a desired pressure, and temperature controlling means are also supplied for maintaining the flow properties of the ink within the container at a desired optimum value. Additionally, means are provided for moving the material to be inked past the outlet orifice of the container at a constant velocity, and means are supplied for controlling the pressure applied to the ink within the container to thereby start and stop the flow of ink through the outlet orifice. In utilizing the apparatus, the temperature of the ink within the container is maintained at a desired value to assure the ink having optimum fluid properties, and the pressure applied to the ink is controlled to thereby start and stop flow through the outlet orifice, while the material to be inked is moved past the outlet orifice at a constant velocity.

Other objects, features and many of the attendant advantages of the invention will be appreciated more readily as the same becomes better understood by reference to the following detailed description when considered in connection with the accompanying drawings, wherein like parts in each of the several figures are identified by the same reference characters, and wherein.

Figure 4:
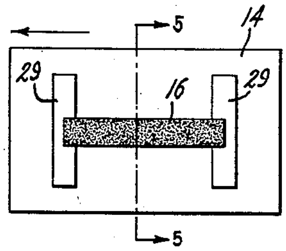
FIG. 4 is a plan view of a printed circuit element produced by means of the present invention.
Figure 5A:
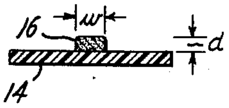
Figure 5B:
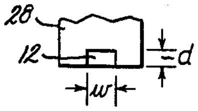
Figures 2, 6A, 6B:
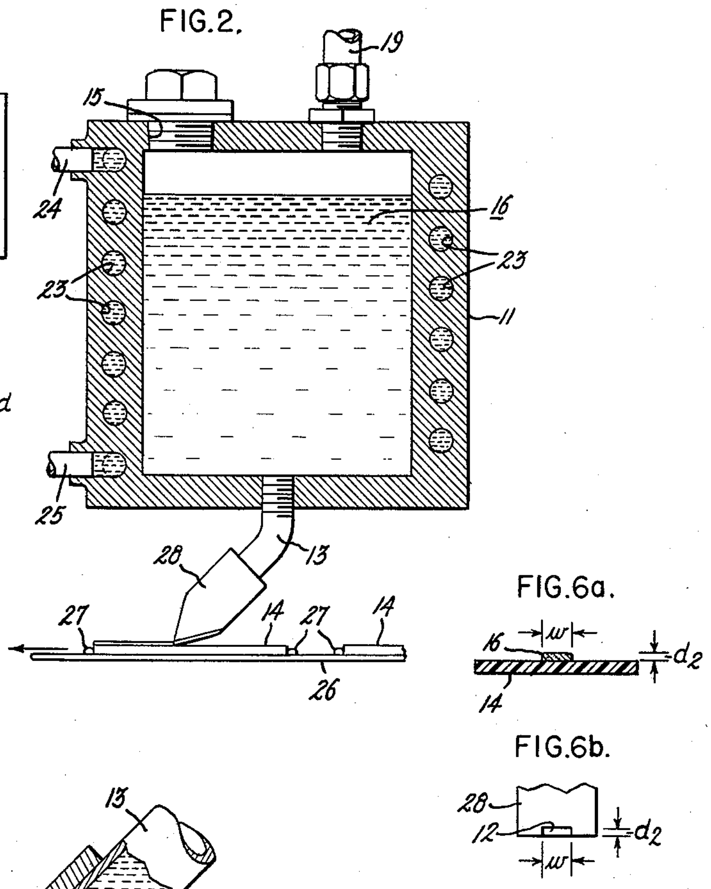
FIG. 2 is a sectional view of a printed ink dispenser constructed in accordance with the invention, and comprising a part of the system illustrated in FIG. 1.

FIG. 5*a* is a cross-sectional view of the printed circuit element shown in FIG. 4, taken through plane 5—5 thereof in the direction indicated by the arrows;

FIG. 5*b* is an end view of a portion of a pen carriage comprising a part of the ink dispenser, and shows an outlet orifice suitable for producing the circuit element shown in FIG. 5*a*;

FIG. 6*a* is a cross-sectional view of a second printed circuit element, produced by means of the present invention, which is similar to that illustrated in FIG. 4, but of slightly modified dimensions, and hence electrical characteristics; and FIG. 6*b* is an end view of an outlet orifice construction suitable for producing the circuit element shown in FIG. 6*a*.

Figure 1:
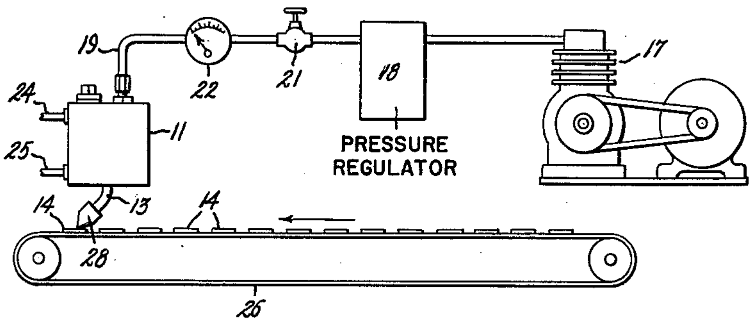
FIG. 1 is a functional block diagram illustrating the method and apparatus for producing printed circuit elements in accordance with the invention.
Figure 3:
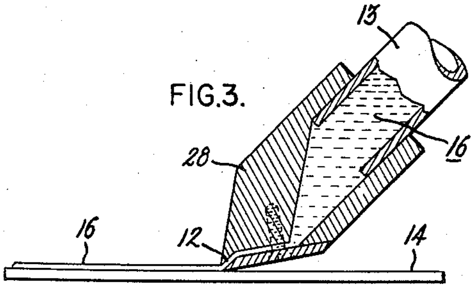
FIG. 3 is a partial sectional view of an outlet orifice construction that comprises a part of the ink dispenser shown in FIG. 2.

The apparatus for dispensing printed circuit ink illustrated schematically in FIG. 1 of the drawings, comprises a container 11, the construction of which is shown in FIG. 2. The container 11 has an outlet orifice 12 therein, best shown in FIGS. 3 and 5*b*, which communicates with the interior of the main body of the container 11 through a flexible conduit 13 that allows the outlet orifice 12 to be disposed adjacent the surface of the backing members 14 on which the ink is to be printed. Additionally, the container 11 has an opening 15 in the top thereof which allows a supply of printed circuit ink 16 contained therein to be replenished, and which is closed in a fluid tight fashion by a threaded plug.

The printed circuit ink 16 within container 11 is subject to pressure from a high pressure air system operatively connected to the container, and comprising an air compressor 17, an air pressure regulating device 18, and a conduit 19 for interconnecting the two with the container 11. If desired, a manually-operated cut-off valve 21, and a pressure indicating instrument 22 may be connected in the conduit 19 between the air compressor 17, and the container 11. By this arrangement, pressure regulator 18, which is preferably automatic in operation, can be used to automatically control the air pressure applied to the upper surface of the printed circuit ink 16.

The pressure applied to the surface of the printed circuit ink 16 within container 11 causes the ink to flow out through the outlet orifice 12, and to be deposited upon the surface of the backing members 14. In order to assure that the fluid flow properties of the printed circuit ink 16 are maintained at an optimum value, temperature controlling means are provided which comprises a heating coil consisting of a plurality of interconnected conduits 23 formed in the sides of the container 11 surrounding the interior portion thereof in which the printed circuit ink 16 is disposed. A suitable heating fluid such as steam or hot water is circulated through conduits 23 by means of inlet and outlet connections 24 and 25, and serves to maintain the temperature, and hence the fluid flow properties, of the printed circuit 16 at an optimum value. While the construction illustrated in FIG. 2 of the drawing is preferred, it is of course possible that the helical conduits 23 could be separate from, and surround the container 11. Other alternative arrangements for maintaining the temperature of the printed circuit ink 16 at an optimum value, could also be satisfactorily used.

In operation, the backing members 14 upon which the ink 16 is to be deposited, are moved past the outlet orifice 12 at a constant velocity by a suitable conveyor belt 26 driven by constant speed motors (not shown) and a suitable pulley wheel arrangement. If desired, the backing members can be supported in a fixed tray and the pen carriage moved relative thereto; however the first arrangement described is preferred. The backing members 14 to be inked, are held in place on the conveyor belt 26 by small detents 27 formed on the surface of the belt, and are successively moved under a pen carriage 28 that is secured to the end of the flexible conduit 13, and in which the outlet orifice 12 is formed. In the embodiment of the invention shown, the pen carriage 28 rides directly on the surface of the backing members 14, and the printed circuit ink 16 is caused to flow out through the outlet orifice 12 in the end thereof, and to deposit upon the backing members in the manner illustrated in FIG. 3. If desired, however, a special pen carriage may be provided for maintaining constant pen orifice to surface of backing member height in order to further insure good reproducibility during successive printing operations.

As best shown in FIG. 4, the backing members 14 have preformed electrically conductive contact areas 29 on each end thereof so that as the backing members travel from right to left in the direction of the arrows shown in FIG. 2, the ink 16 deposited thereon through outlet orifice 12 extends between and connects the contact areas. The flow of ink 16 through the outlet orifice 12 is caused to start and stop at the respective contact areas by pressure regulators 18 which causes the pressure applied to the surface of printed circuit ink 16 to rise above or fall below critical values to initiate and stop plug flow of the ink.

In order to assure good control over the start and stop of ink flow through the outlet orifice 12, it is desirable that the dimensions of the outlet orifice 12 be somewhat proportioned to the desired dimensions (and hence desired electrical characteristics) of the printed circuit element formed by the ink 16. This requirement is best illustrated in FIGS. 5*a* and 5*b* and in FIGS. 6*a* and 6*b* of the drawings. Considering FIG. 4, if a cross-section is taken of the printed circuit element formed by the printed circuit ink 16 in a plane perpendicular to the direction of travel of the backing member 14, and hence perpendicular to the long dimension of the printed circuit element, the cross section would appear as shown in FIG. 5*a* of the drawings. By comparing the cross-section of the printed circuit element 16 shown in FIG. 5*a*, to an end view of the outlet orifice 12 formed in the end of pen carriage 28, illustrated in FIG. 5*b*, it can be appreciated that the width $w$ of the printed circuit element 16 is substantially equal to the width $w$ of the outlet orifice 12, and depth $d$ of the printed circuit element 16 is substantially equal to the dimension $d$ of the outlet orifice 12. The dimensions of the cross-sectional area of the printed circuit elements 16 (and hence the electrical characteristics thereof) can be controlled somewhat by the variations within a restricted range of the pressure applied to the surface of the ink 16 within container 11; however, in order to effect rather large changes, such as a reduction of one half in the resistance value of a printed resistor, then, assuming that the resistance value of the printed resistor is a linear function of its depth $d$, the depth $d$ of the printed circuit element 16 must be decreased to one-half the depth of the element shown in FIG. 5*a*. To accomplish such a large change in resistance value, it would be necessary to provide a new pen carriage 28 shown in FIG. 6*b* having an outlet orifice 12 whose depth $d/2$ is in the order of one-half the depth $d$ of the outlet orifice 12 shown in the pen carriage 28 of FIG. 5*b*. Consequently, it can be appreciated that for the best results, and greater control over the flow and cut-off of the printed circuit ink 16, it is desirable that the outlet orifice 12 be somewhat comparable in cross-section to the cross-section of the printed circuit element to be produced.

Prior to the production of printed circuit elements in accordance with the invention, a pen carriage 28 is provided for the flexible conduit 13 which has a suitable size outlet orifice 12 therein selected in accordance with the considerations set forth in the preceding paragraph. The container 11 is then filled with the particular printed circuit ink 16 to be deposited on the backing members 14.

While there are many known printed circuit inks suitable for use in practicing the invention, one composition which has been successfully used constitutes a printed resistor element upon polymerizing, and is described in an article entitled "New Injection Molding Process for Printed Resistors" appearing in Electrical Manufacturing magazine, January, 1955 issue, R. S. Marty, E. M. Davies, and P. J. Franklin authors. This composition comprises essentially about ten (10) to thirty (30) percent by weight of finely pulverized carbon suspended in a resin-solvent solution. The exact amount of carbon in any composition along with the amount of ink deposited controls the resistance value of the printed element upon polymerization. Hence by varying, the amount of carbon content in the ink composition and/or by varying the pressure applied to the surface of the ink, the resistance value of the ultimate printed resistor can be controlled within a restricted range of values. To effect substantial changes in resistance value, the technique described in the preceding paragraph must be used. If desired, other printed circuit inks could be satisfactorily substituted in the place of that described above.

Upon the container 11 being filled with a suitable printed circuit ink, heating fluid is supplied to the conduit or heating coils 23, and the ink brought up to a temperature such that it exhibits the desired fluid properties. With relation to the specific ink composition identified, the temperature of the ink may range in the vicinity of thirty degrees centigrade (30° C.), however, after a batch (container full) has been started, the temperature should not be allowed to vary more than ± one tenth of one degree centigrade (±.1° C.) for best results.

At this point the air compressor is started up, and the high pressure air system brought up to a pressure of from twenty (20) to thirty (30) pounds gage. The regulating device then operates to maintain the preset pressure, and to subject the surface of the printed circuit ink in container 11 to such pressure, or to vent the container to atmospheric pressure to thereby start and stop flow of the printed circuit ink out through the outlet orifice 12. Operation of the pressure regulator is then synchronized with the movement past the outlet orifice 12 of the backing members 14 which have been loaded on the conveyor belt 26 by a suitable loading device. In this manner printed circuit ink 16 is caused to flow out of the outlet orifice 12 upon the leading contact area 29 of a particular backing member passing under the outlet orifice, and to cut-off flow of the printed circuit ink upon the following or lagging contact area 29 thereof coming under the outlet orifice. If desired, the pressure applied to the surface of printed circuit inks 16 within the main body of container 11 may be controlled manually to effect the same result. Hence, as the backing members 14 pass at constant velocity under the outlet orifice 12, the printed circuit ink is caused to be deposited on each successive backing member in a uniform layer due to the fact that all the conditions determining flow of the ink upon the backing member are known, and are subject to control. Because of this fact, successively produced printed circuit elements have identical electrical characteristics, or in the event any variations the electrical characteristics do occur, such variations are within acceptable tolerance ranges.

From the foregoing descriptions, it can be appreciated that the invention provides a new and improved method and apparatus for dispensing printed circuit inks upon backing members whereby a large percentage of the printed circuit elements successively produced all have similar electrical characteristics, and any variations in the electrical characteristics that do occur in some of the elements, are within acceptable tolerance ranges.

Obviously, other modifications and variations of the invention will be suggested to those skilled in the art in the light of the above teachings. It is therefore to be understood that changes may be made in the particular embodiment of the invention described which are within the full intended scope of the invention as defined by the appended claims.

What we claim as new and desire to secure by Letters Patent of the United States is:

An apparatus for dispensing printed circuit inks onto backing members to produce printed circuit elements having similar electrical characteristics and to maintain any variations in the electrical characteristics of said elements within acceptable tolerance range comprising:

(*a*) a container for said printed circuit inks having an outlet orifice disposable adjacent the surface of said backing members to be inked with the opening of the orifice substantially perpendicular to the backing members, and a fluid tight opening for replenishing the supply of ink contained therein, said outlet orifice having a cross section similar in size and shape to the cross section of said printed circuit elements;

(*b*) a high pressure air system operatively connected to said container for subjecting said printed circuit ink within said container to a desired pressure, wherein said high pressure system is preset to operate within the range of about twenty to thirty pounds per square inch gage, said high pressure air system including an air pressure regulating device for controlling the pressure applied to the ink within said container;

(*c*) a heating coil means comprising a plurality of interconnected conduits formed in the sides of said container surrounding the interior portion thereof, said printed circuit ink being disposed in said interior portion, said heating coil means for maintaining the flow property of the ink flowing out through said outlet orifice at an optimum value by controlling the temperature of said printed circuit ink within said container in the vicinity of about thirty degrees centigrade, and after the ink begins to flow out through said outlet orifice said heating coil means for maintaining the temperature within about one tenth of one degree centigrade for said optimum value flow; and (*d*) a constant speed conveyor for moving said backing members to be inked past the outlet orifice in said container at a constant velocity, the surface of said conveyor having detents thereon for retaining the backing members to be inked as the same are moved past said outlet orifice and ink is deposited thereon.

References Cited in the file of this patent

UNITED STATES PATENTS

| | | |
|---|---|---|
| 1,390,367 | Massey | Sept. 13, 1921 |
| 2,069,256 | MacKenzie | Feb. 2, 1937 |
| 2,126,810 | Pugh | Aug. 16, 1938 |
| 2,274,432 | Repsher et al. | Feb. 24, 1942 |
| 2,697,253 | Krupft | Dec. 21, 1954 |
| 2,725,033 | Pulford | Nov. 29, 1955 |
| 2,845,656 | Gabbrielli | Aug. 5, 1958 |

FOREIGN PATENTS

| | | |
|---|---|---|
| 690,696 | Great Britain | Apr. 29, 1953 |

OTHER REFERENCES

National Bureau of Standards Circular 468, Nov. 15, 1947, p. 12.

Chemical Rubber Pub. Co., Handbook of Chemistry and Physics, 35 edition, 1953–54, pp. 1994–99.